United States Patent [19]

Bush et al.

[11] 4,454,562
[45] Jun. 12, 1984

[54] KEYSWITCH WITH TELESCOPING PLUNGER

[75] Inventors: Robert D. Bush, Coeur d'Alene, Id.; Dean S. Cowles, Spokane, Wash.

[73] Assignee: General Instrument Corporation, New York, N.Y.

[21] Appl. No.: 418,674

[22] Filed: Sep. 15, 1982

[51] Int. Cl.³ .......................... H01G 5/16; H01H 3/12
[52] U.S. Cl. .................................... 361/288; 200/340;
200/DIG. 1; 340/365 C
[58] Field of Search .............. 200/5 A, 159 A, 159 B,
200/159 R, 340, DIG. 1; 340/365 C; 361/288;
400/479.1

[56] References Cited

U.S. PATENT DOCUMENTS

| | | | |
|---|---|---|---|
| 3,582,594 | 6/1971 | Tuyford | 200/340 |
| 3,773,997 | 11/1973 | Evans et al. | 200/159 B |
| 3,777,082 | 12/1973 | Hatley et al. | 200/159 B |
| 3,780,237 | 12/1973 | Seeger | 200/5 A |
| 3,856,998 | 12/1974 | Sims | 200/5 A |
| 3,965,399 | 6/1976 | Walker et al. | 340/365 C |
| 3,993,884 | 11/1976 | Kondur et al. | 200/340 |
| 4,090,229 | 5/1978 | Cencel et al. | 361/288 |
| 4,129,758 | 12/1978 | Gilano et al. | 200/159 B |
| 4,156,802 | 5/1979 | Gilano et al. | 200/5 A |
| 4,207,448 | 6/1980 | Furusawa et al. | 200/159 B |
| 4,274,752 | 6/1981 | Huber et al. | 340/365 C |
| 4,325,102 | 4/1982 | English | 361/288 |

*Primary Examiner*—John W. Shepperd
*Attorney, Agent, or Firm*—Barry R. Lipsitz

[57] ABSTRACT

A low profile keyswitch utilizes a telescoping plunger assembly. A linear feel and overtravel are achieved. The telescoping plunger assembly includes an outer plunger shaft and an inner plunger shaft slideably mounted therewithin for telescopic extension therefrom. A retaining member locks one end of the inner plunger shaft within the outer plunger shaft, thereby defining the maximum extension of the inner plunger. A spring biases the inner plunger into its fully extended position.

11 Claims, 5 Drawing Figures

KEYSWITCH WITH TELESCOPING PLUNGER

BACKGROUND OF THE INVENTION

The present invention relates to keyswitches for use in computer terminals, typewriters, and the like and more particularly to an actuator assembly for use in a low profile keyswitch which includes a telescoping plunger.

Keyswitches of conventional design generally include a plunger which is slideably mounted within a housing. The plunger is designed to slide downwardly when the keytop of the keyswitch is pressed. Downward pressure on the keytop actuates an electrical switch coupled to the plunger.

For certain applications, it is desirable to have a keyswitch which is shorter than those of conventional design. Such shorter keyswitches are known as "low-profile" switches. One problem which has been encountered in designing low-profile keyswitches is that it has been difficult to maintain the desirable characteristics of prior full size keyswitches while reducing the switch height. Such desirable characteristics include full travel, such that the amount of downward movement of the keytop will be substantially the same in the low profile switch as in full size switches; a linear feel; overtravel; and hysteresis.

In a keyswitch with linear feel, the amount of force required to press the switch from its nonactuated to its fully depressed condition increases linearly as the plunger travels downwardly. In a keyboard, such as a typewriter keyboard manufactured from a plurality of keyswitches, the provision of linear feel reduces fatigue on the fingers of the keyboard operator. The use of linear feel keyswitches also increases accuracy by providing a certain degree of feedback to the keyboard operator and facilitates the efficiency of keyboard operation.

In a keyswitch with overtravel, electrical contact is made (i.e., the switch turns "on") before the keytop is fully depressed. Overtravel provides for more reliable switch operation, because keyboard operators often inadvertently fail to press the keyswitch down the whole way, particularly when typing at a high rate of speed. When overtravel is provided, the keyswitch will turn on as long as the plunger is depressed at least to the point where electrical contact is made.

The provision of hysteresis in a keyswitch results in a lag in the electrical response of the switch. For example, if the point at which a keyswitch "makes" an electrical connection on the downward stroke of the plunger is further down than the point at which the electrical connection "breaks" on the upward stroke, the switch is said to have a positive hysteresis. If the make and break points in the switch are at the exact same physical location on the downward and upward strokes (i.e., no hysteresis), it will be possible for a keyswitch operator to unintentionally produce multiple actuations if any hesitation is made at the exact moment the switch turns on. This phenomenon is known as "teasing" the switch, because what is meant as one switch actuation may be interpreted by the circuitry actuated by the switch as a plurality of actuations. Where the switch is designed such that it must pass through the make point on its return stroke before the break point is reached, such teasing, with the resultant possibility of error, will be prevented.

It would be advantageous to provide a low-profile keyswitch combining the favorable characteristics of hysteresis, overtravel, linear force, and a "full travel" of the keytop. The present invention relates to such a keyswitch.

SUMMARY OF THE INVENTION

An actuator assembly for use in a low profile keyswitch is provided which comprises a housing and a telescoping plunger spring loaded by a return spring into a first position within the housing. A channel is provided in the housing through which the plunger can slide from the first position to a second position. Spring means is provided for biasing the telescoping plunger into its fully extended position.

The use of the telescoping plunger enables a low profile keyswitch to respond in a manner similar to that of a full size keyswitch. Full travel is provided by the collapsing of the telescoping plunger sections during the downward stroke of the keyswitch.

BRIEF DESCRIPTION OF THE DRAWINGS

FIG. 2 is a cross-sectional view of the keyswitch shown in FIG. 1, which is pressed down to just before the point at which the switch turns on;

DETAILED DESCRIPTION OF THE INVENTION

Figure 1:
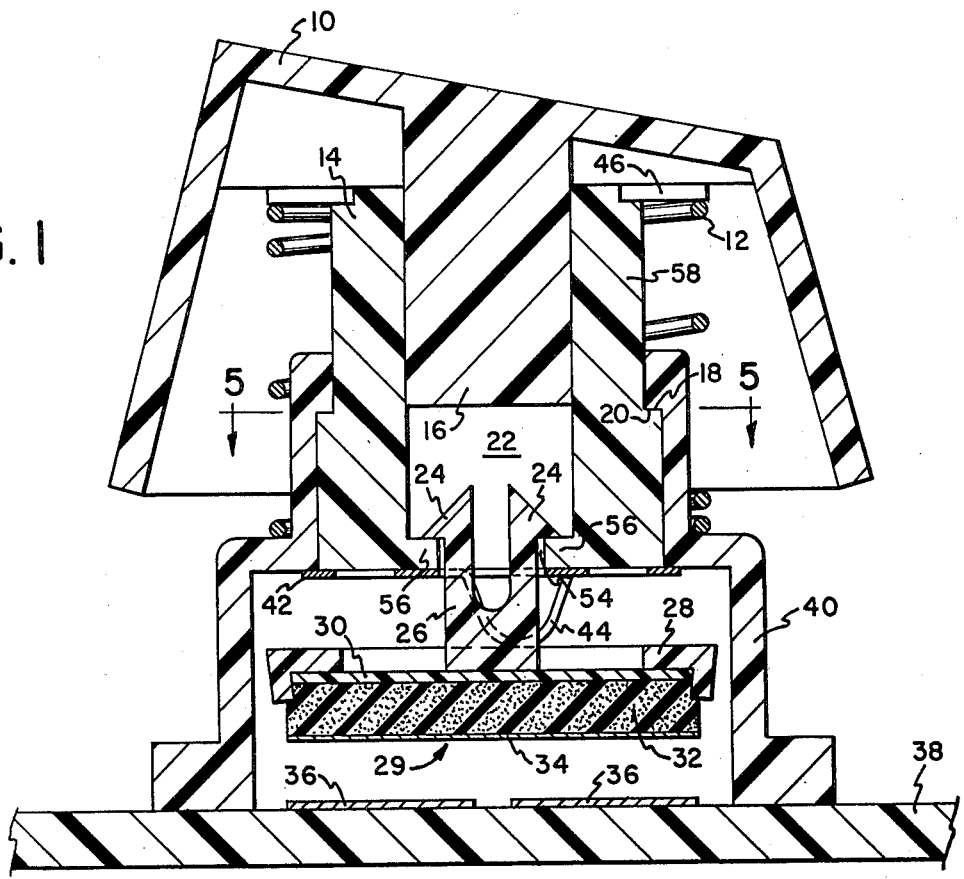
FIG. 1 is a cross-sectional view of a keyswitch in accordance with the present invention in its normal, non-depressed state.

FIG. 1 shows the construction of a low-profile keyswitch in accordance with the present invention. The keyswitch includes a housing 40 which has a channel 50 therein (see FIG. 2) through which a telescoping plunger comprising an outer plunger shaft 14 and an inner plunger shaft 26 passes. Outer plunger shaft 14 is arranged so that it can slide within channel 50. One end of outer plunger shaft 14 includes a flange 46 against which one end of a spring 12 provides a force in an upward direction. The other end of spring 12 bears against a portion of housing 40. When the keyswitch is not actuated, spring 12 maintains the switch in its nondepressed (turned-off) position. Spring 12 is prevented from pushing outer plunger shaft 14 completely out of channel 50 by a shoulder 20 on outer plunger shaft 14 which abuts with a corresponding shoulder 18 in housing 40.

Outer plunger shaft 14 has a generally hollow center 22 into which stud 16 of a keytop 10 is press fit. Keytop 10 is angled so that when a plurality of such switches are used to fabricate a keyboard, the keytops are angled toward the keyboard operator.

Figure 4:
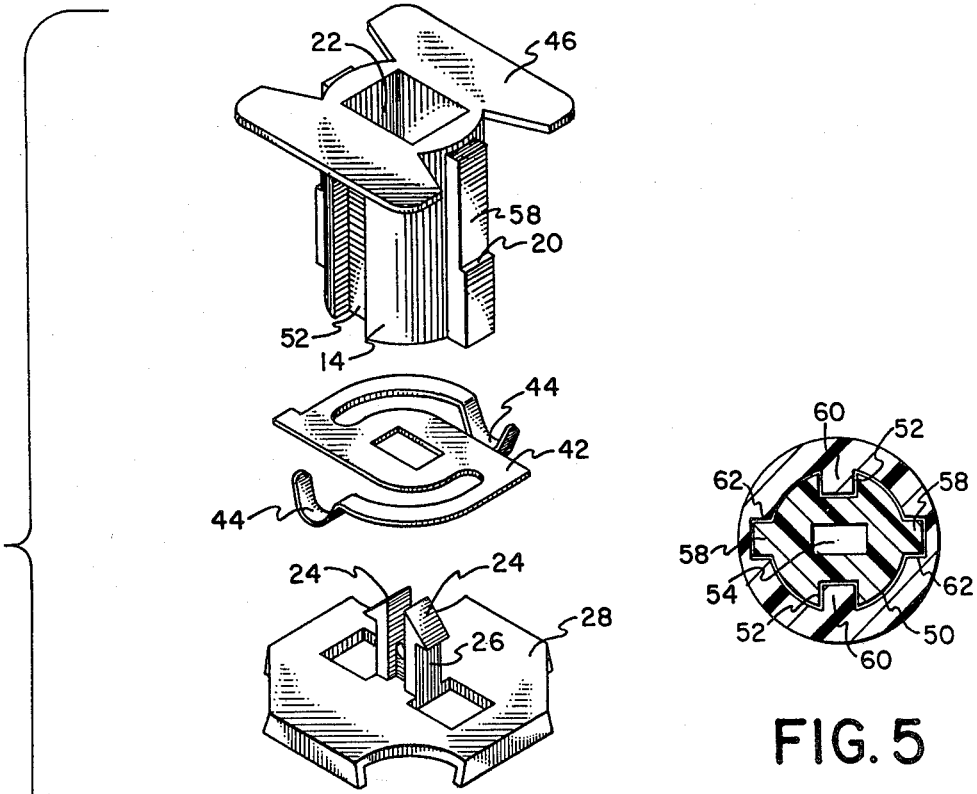
FIG. 4 is an exploded view of the telescoping plunger assembly of the present invention.

Inner plunger shaft 26 is mounted in telescoping relation with outer plunger shaft 14. One end of inner plunger shaft 26 is retained within the channel 22 of outer plunger shaft 14 through the use of a pair of resilient tapered tabs 24. The arrangement of tabs 24 within channel 22 provides a floating joint between inner plunger shaft 26 and outer plunger shaft 14, so that an actuating assembly (described hereinafter) attached to inner plunger shaft 26 will be self-leveling. In assembling the telescoping plunger, tabs 24 are pushed into a hole 54 and snap over a shoulder 56 at one end of outer plunger shaft 14. Tabs 24 thereby serve as a retaining means and define the maximum extension of inner plunger shaft 26 from outer plunger shaft 14. A spring 42, most clearly shown in FIG. 4, is provided between outer plunger shaft 14 and a rigid retaining plate 28 which is attached to inner plunger shaft 26. Spring 42 includes a plurality of spring fingers 44 cut therefrom which protrude beyond the flat surface of spring 42. Spring 42 thereby biases the telescoping plunger into its fully extended position. Retaining plate 28 holds a capacitive switch actuator assembly comprising a plastic plate 30, foam pad 32, and metalized foil 34 which can comprise metalized mylar. Plastic plate 30 snaps into and is retained by rigid retaining plate 28.

The keyswitch is mounted on a printed circuit board 38 which contains a switching element 36. In the embodiment shown in the figures, the keyswitch is a capacitive type switch in which the change in position of metalized foil layer 34 serves to change the capacitance across switching element 36. Switching element 36 comprises two conductive plates which, in conjunction with metalized foil layer 34, form a pair of series connected capacitors. The change in capacitance which occurs when foil layer 34 is brought adjacent plates 36 is sensed by electronic circuitry (not shown) to indicate an actuation, or turning on, of the keyswitch. Those skilled in the art will appreciate that different types of actuators for different types of switching mechanisms can alternatively be attached to inner plunger shaft 26.

Figure 2:
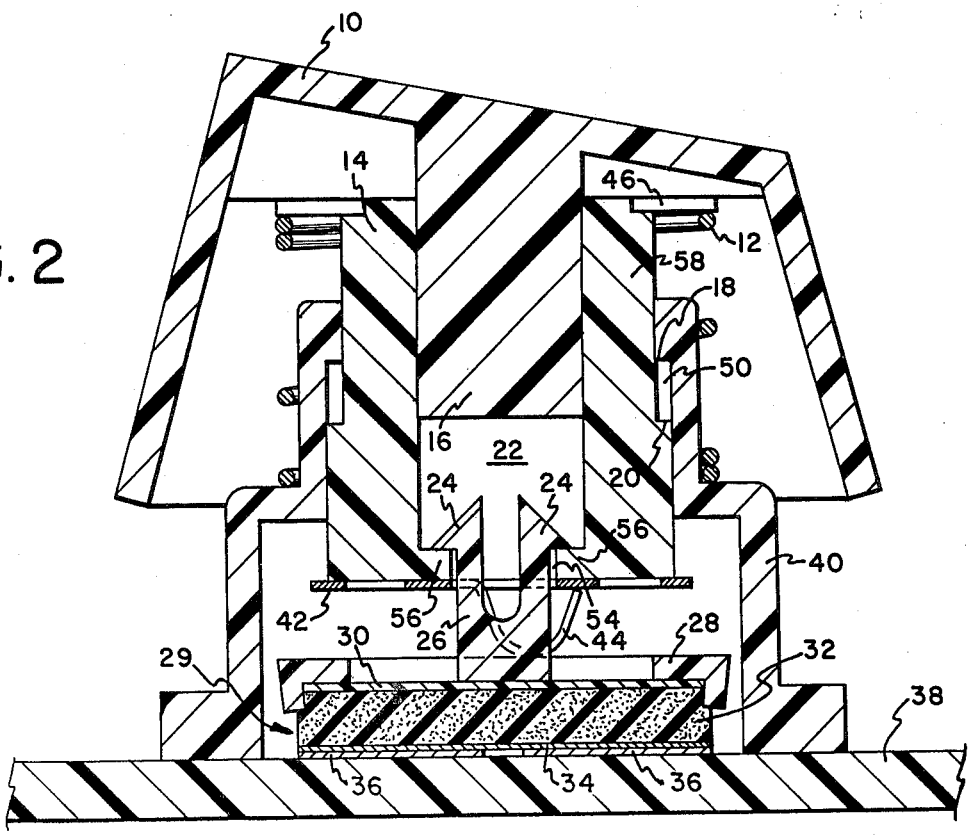

FIG. 2 shows the switch of FIG. 1 when keytop 10 has been pressed down just to the point at which switch actuating assembly 29 contacts a switching element 36 on circuit board 38. As can be seen, at the point of contact, outer plunger shaft 14 has slid from a first position shown in FIG. 1 to an intermediate position, causing spring 12 to compress. Inner plunger shaft 26 remains fully extended with respect to outer plunger shaft 14, and spring 42 therefore remains in its uncompressed normal state.

Figure 3:
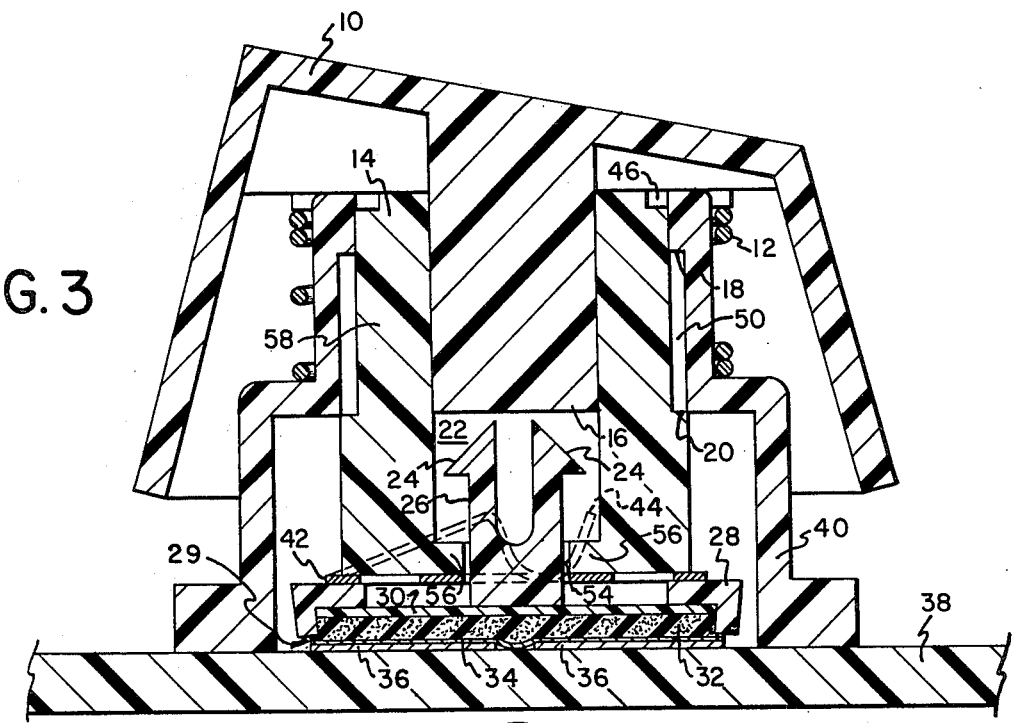
FIG. 3 is a cross-sectional view of the keyswitch shown in FIGS. 1 and 2, when it is fully depressed.

FIG. 3 shows the keyswitch of FIGS. 1 and 2 in its fully depressed state. As shown, inner plunger shaft 26 is collapsed within hollow 22 of outer plunger shaft 14. As a result, spring 42 is compressed with protruding fingers 44 having been deflected upwardly. Foam pad 34 also compresses when the keyswitch is fully depressed. The combination of springs 12, 42, and the inherent spring constant of foam pad 32 combine to increase the hysteresis of the keyswitch.

The provision of overtravel in the keyswitch of the present invention can be best understood by comparing FIG. 2 to FIG. 3. In FIG. 2, switch actuator assembly 29 has just made contact with switching element 36. Interior plunger shaft 26 is still fully extended from outer plunger shaft 14. For a capacitive type keyswitch as shown in the figures, the switch will turn on just past the point at which actuator assembly 29 makes contact with switching element 36. Continued downward pressure on keytop 10 causes inner plunger shaft 26 to collapse into the hollow portion 22 of outer plunger shaft 14. This collapse, or telescoping action provides the desired overtravel. Additional overtravel is provided when foam pad 32 compresses. The mechanism which provides overtravel also results in a low profile keyswitch with a full travel feel similar to that achieved by full size keyswitches.

FIG. 4 is an exploded view of the telescoping plunger assembly. Inner plunger shaft 26, which extends from rigid pad retainer 28 contains resilient tapered tabs 24 which snap into outer plunger shaft 14. Spring 42 is sandwiched between outer plunger shaft 14 and rigid pad retainer 28. Plate 30 carrying foam pad 32 and metalized foil 34 snaps into rigid pad retainer 28.

Figure 5:
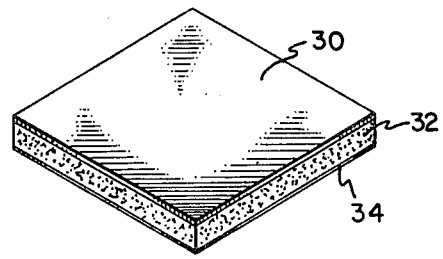
FIG. 5 is a plan view taken substantially along the line 5—5 of FIG. 1, which has been simplified to show the rib and channel arrangement of the outer plunger shaft within the keyswitch housing.

Ribs 58 are provided on outer plunger shaft 14, along with grooves 52 in order to provide a favorable length to width ratio for the plunger bearing surfaces, resulting in a smooth sliding action when the plunger is depressed. The rib and groove arrangement also prevents the plunger from rotating within housing 40. As shown in FIG. 5, housing 40 contains grooves 62 which correspond to ribs 58, and contains ribs 60 which correspond to grooves 52. Those skilled in the art will appreciate that other configurations of ribs and grooves can be used to provide the desired smooth plunger operation and to prevent rotation of the plunger within the housing.

We claim:

1. An actuator assembly for a low profile keyswitch comprising:
    a housing;
    an outer plunger;
    a channel in said housing through which said outer plunger can slide from a first position to a second position;
    means for spring loading said outer plunger into said first position;
    an inner plunger slidably mounted within one end of said outer plunger for telescopic extension therefrom;
    means for floatably retaining one end of said inner plunger within said outer plunger, thereby defining the maximum extension of said inner plunger from said outer plunger;
    means for spring loading said inner plunger into its fully extended position; and
    actuator means at the other end of said inner plunger for actuating a switching element mounted thereunder when said outer plunger is moved from said first to said second position, said actuator having a perimeter smaller than that of the adjacent portions of said housing to enable the actuator to float freely within said housing;
    whereby said actuator is self-leveling to provide uniform contact with a switching element actuated thereby.

2. The assembly of claim 1 wherein said outer plunger comprises a plurality of ribs and grooves which mesh with a plurality of corresponding grooves and ribs in said channel.

3. The assembly of claim 1 wherein said means for spring loading said inner plunger comprises a substantially flat piece of spring material sandwiched between said one end of said outer plunger and said actuator means and having a plurality of spring fingers cut therefrom with portions of said fingers protruding beyond the flat surface of said piece.

4. The assembly of claim 1 further comprising actuator means at the other end of said inner plunger for actuating a switching element mounted thereunder when said outer plunger is moved from said first to said second position.

5. The assembly of claim 1 wherein said actuator means comprises a rigid retaining plate having a foam pad assembly mounted thereto, said foam pad assembly comprising a plate which is snapped into and retained by said rigid retaining plate, a foam pad mounted to the surface of said plate, and a metalized foil secured to the foam pad for actuation of a capacitive type switching element.

6. The assembly of claim 1 further comprising a keytop mounted to the other end of said outer plunger.

7. The assembly of claim 1 wherein said means for spring loading said outer plunger into said first position comprises a spiral spring having a first end which bears against a flange extending from the other end of said outer plunger and a second end which bears against a portion of said housing.

8. The assembly of claim 1 wherein said inner plunger comprises a pair of spaced, free-standing arms which terminate to form a pair of tapered tabs, and said retaining means comprises a shoulder extending partially across said one end of said outer plunger over which said tapered tabs are snapped.

9. A telescoping plunger assembly for use in a low profile keyswitch comprising:

an outer plunger shaft;

an inner plunger shaft slidably mounted within one end of said outer plunger shaft for telescopic extension therefrom;

means for retaining one end of said inner plunger shaft within said outer plunger shaft; thereby defining the maximum extension of said inner plunger;

a switch actuator at the other end of said inner plunger shaft; and a substantially flat piece of spring material sandwiched between said one end of said outer plunger shaft and said switch actuator and having a plurality of spring fingers cut therefrom with portions of said fingers protruding beyond the flat surface of said piece for spring loading said inner plunger shaft into its fully extended position.

10. The assembly of claim 9 wherein said retaining means comprises a plurality of tapered resilient tabs extending from said inner plunger shaft which snap over a shoulder extending partially across said one end of said outer plunger shaft.

11. The assembly of claim 9 further comprising means at the other end of said outer plunger shaft for accomodating a keytop.

* * * * *